(12) United States Patent
Kim et al.

(10) Patent No.: US 11,532,270 B2
(45) Date of Patent: Dec. 20, 2022

(54) ORGANIC LIGHT-EMITTING DIODE DISPLAY

(71) Applicant: SAMSUNG DISPLAY CO., LTD., Yongin-si (KR)

(72) Inventors: Mi-Hae Kim, Asan-si (KR); Ki-Myeong Eom, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/567,824

(22) Filed: Jan. 3, 2022

(65) Prior Publication Data

US 2022/0122530 A1   Apr. 21, 2022

Related U.S. Application Data

(63) Continuation of application No. 16/906,959, filed on Jun. 19, 2020, now Pat. No. 11,217,157, which is a
(Continued)

(30) Foreign Application Priority Data

Jan. 22, 2015 (KR) .......................... 10-2015-0010603

(51) Int. Cl.
  *G09G 3/3225* (2016.01)
  *H01L 27/32* (2006.01)

(52) U.S. Cl.
  CPC ....... *G09G 3/3225* (2013.01); *H01L 27/3262* (2013.01); *H01L 27/3265* (2013.01);
(Continued)

(58) Field of Classification Search
  CPC ... G09G 2300/0426; G09G 2310/0286; G09G 3/3266
  See application file for complete search history.

(56) References Cited

U.S. PATENT DOCUMENTS 7,023,508 B2   4/2006   You
7,304,639 B2   12/2007  Park et al.
(Continued)

FOREIGN PATENT DOCUMENTS

KR   10-2005-0052033 A   6/2005
KR   10-2006-0128271 A   12/2006
(Continued)

OTHER PUBLICATIONS

Korean Notice of Allowance dated May 23, 2022, issued in Korean Patent Application No. 10-2015-0010603 (5 pages).

*Primary Examiner* — Van N Chow
(74) *Attorney, Agent, or Firm* — Lewis Roca Rothgerber Christie LLP

(57) ABSTRACT

An organic light-emitting diode (OLED) display is disclosed. In one aspect, the OLED display includes a data line disposed on a substrate and extended in a first direction, a power line disposed on the substrate and extended in the first direction, a scan signal line disposed on the substrate across the data line, an active layer formed over the substrate, wherein the active layer includes first to fourth regions, wherein the first and fourth regions are connected to each other through a connecting region, a first transistor including the active layer formed between the first region and the second region, a second transistor including the active layer formed between the third region and the fourth region, and wherein the active layer is extended from the first region, the organic light emitting diode is electrically coupled to the first transistor, and a storage capacitor including a first electrode and a second electrode formed over the first electrode, wherein the second electrode overlaps with at least of an area of the first electrode. The second electrode is extended to the connecting region and disposed between the active layer and a line extended in the first direction in the connecting area.

20 Claims, 8 Drawing Sheets

Related U.S. Application Data continuation of application No. 16/384,788, filed on Apr. 15, 2019, now Pat. No. 10,692,426, which is a continuation of application No. 15/911,059, filed on Mar. 2, 2018, now Pat. No. 10,262,583, which is a continuation of application No. 14/844,463, filed on Sep. 3, 2015, now Pat. No. 9,911,379.

(52) U.S. Cl.
CPC . *H01L 27/3276* (2013.01); *G09G 2300/0819* (2013.01); *G09G 2300/0847* (2013.01); *G09G 2310/0262* (2013.01); *G09G 2320/0219* (2013.01); *G09G 2320/045* (2013.01)

(56) References Cited

U.S. PATENT DOCUMENTS

| | | | |
|---|---|---|---|
| 8,054,396 B2 | 11/2011 | Moon et al. | |
| 8,502,292 B2 | 8/2013 | Kato et al. | |
| 8,809,853 B2 | 8/2014 | Saito et al. | |
| 9,165,993 B2* | 10/2015 | Kim | H01L 27/3276 |
| 9,355,594 B2 | 5/2016 | Lee et al. | |
| 9,412,297 B2* | 8/2016 | Kim | H01L 51/56 |
| 9,450,040 B2* | 9/2016 | Kim | H01L 27/3248 |
| 10,262,583 B2* | 4/2019 | Kim | G09G 3/3225 |
| 2015/0014641 A1 | 1/2015 | Jung et al. | |
| 2015/0243717 A1* | 8/2015 | Yamazaki | H01L 27/1296 257/40 |
| 2016/0055792 A1 | 2/2016 | Lee et al. | |
| 2021/0074785 A1 | 3/2021 | Kim et al. | |

FOREIGN PATENT DOCUMENTS

| | | |
|---|---|---|
| KR | 10-2009-0110485 A | 10/2009 |
| KR | 10-2014-0018623 A | 2/2014 |
| KR | 10-2014-0053602 A | 5/2014 |
| KR | 10-1401452 B1 | 5/2014 |
| KR | 10-2014-0120734 A | 10/2014 |
| KR | 10-2015-0007742 A | 1/2015 |

\* cited by examiner

ORGANIC LIGHT-EMITTING DIODE DISPLAY

CROSS-REFERENCE TO RELATED APPLICATIONS

This application is a continuation of U.S. patent application Ser. No. 16/906,959, filed Jun. 19, 2020, which is a continuation of U.S. patent application Ser. No. 16/384,788, filed Apr. 15, 2019, now U.S. Pat. No. 10,692,426, which is a continuation of U.S. patent application Ser. No. 15/911,059, filed Mar. 2, 2018, now U.S. Pat. No. 10,262,583, which is a continuation of U.S. patent application Ser. No. 14/844,463, filed Sep. 3, 2015, now U.S. Pat. No. 9,911,379, which claims priority under 35 U.S.C. § 119 to and the benefit of Korean Patent Application No. 10-2015-0010603, filed Jan. 22, 2015, the entire content of all of which is incorporated herein by reference.

BACKGROUND

Field

The described technology generally relates to an organic light-emitting diode display.

Description of the Related Technology

An organic light-emitting diode (OLED) display includes a matrix of pixels each including OLEDs. Light emitted from OLEDs can have a wavelength corresponding to a type of an organic material included in the OLED. For example, OLEDs include different types of organic materials corresponding to red, green or blue colored light. The emitted light is combined so that an image is displayed.

The OLED pixels can be connected to lines or conductive lines. As the resolution of an OLED display increases, a parasitic capacitor can be generated between the lines or the conductive lines of the pixels.

SUMMARY OF CERTAIN INVENTIVE ASPECTS

One inventive aspect relates to an OLED display having an improved display quality.

Another aspect is an OLED display that includes a substrate, an active pattern on the substrate, and the active pattern including a first region, a second region, a third region, and a fourth region, the first region and the fourth region being connected to each other, a gate insulation layer covering the active pattern on the substrate, a first gate electrode on the gate insulation layer, the first gate electrode defining a first transistor together with the first region and the second region, a second gate electrode on the gate insulation layer, the second gate electrode defining a second transistor together with the third region and the fourth region, a first insulating interlayer covering the first gate electrode and the second gate electrode on the gate insulation layer, a conductive pattern on the first insulating interlayer, the conductive pattern overlapping the first region and the fourth region of the active pattern, the conductive pattern defining a storage capacitor together with the first gate electrode, and an organic light emitting diode configured to receive a driving current from the first transistor.

In an embodiment, the OLED display includes a second insulating interlayer covering the conductive pattern on the first insulating interlayer, and a data line on the second insulating interlayer, the data line overlapping the fourth region of the active pattern.

In an embodiment, the conductive pattern reduces a parasitic capacitance between the data line and the fourth region of the active pattern.

In an embodiment, the data line overlaps the third region of the active pattern, and can be connected to the third region.

In an embodiment, the active pattern includes a fifth region, a sixth region, a seventh region, an eighth region, a ninth region, a tenth region, an eleventh region, a twelfth region, a thirteenth region and a fourteenth region.

In an embodiment, the OLED display further includes a third gate electrode on the gate insulation layer, the third gate electrode defining a fourth transistor together with the seventh region and the eighth region, a fourth gate electrode on the gate insulation layer, the fourth gate electrode defining a fifth transistor together with the ninth region and the tenth region, and defining a sixth transistor together with the eleventh region, and the twelfth region, and a fifth gate electrode on the gate insulation layer, the fifth gate electrode defining a seventh transistor together with the thirteenth region and the fourteenth region, and the second gate electrode can define a third transistor together with the fifth region and the sixth region.

In an embodiment, the tenth region is connected to the first region and the fourth region, the second region is connected to the fifth region and the eleventh region, the sixth region is connected to the eighth region, and the twelfth region is connected to the fourteenth region.

In an embodiment, the first region, the fourth region, and tenth region are defined as a source node, and the source node is located between a channel region of the first transistor, a channel region of the second transistor, and a channel region of the fifth transistor.

In an embodiment, the conductive pattern overlaps at least about 50% of an area of the source node.

In an embodiment, the conductive pattern overlaps at least about 80% of an area of the source node.

In an embodiment, the second gate electrode receives a current scan signal, the third gate electrode and the fifth gate electrode receive a previous scan signal, the fourth gate electrode receives an emission signal, and the seventh gate electrode and thirteen gate electrode receive an initialization voltage.

In an embodiment, the OLED display further includes a power line connected to the conductive pattern and the ninth region of the active pattern on the second insulating interlayer, a first connection pattern connected to the first gate electrode and the eighth region on the second insulating interlayer, and a second connection pattern connected to the twelfth region on the second insulating interlayer.

In an embodiment, the data line can receive a data signal, and the power line is configured to receive a first power voltage.

In an embodiment, the OLED display further includes a third insulating interlayer covering the data line, the power line, the first connection pattern, and the second connection pattern on the second insulating interlayer, and a first electrode connected to the second connection pattern on the third insulating interlayer.

In an embodiment, the OLED display further includes a pixel defining layer on the third insulating interlayer, an organic light emitting layer on the first electrode, and a second electrode on the pixel defining layer and the organic light emitting layer.

In an embodiment, the second electrode receives a second power voltage.

In an embodiment, the organic light emitting diode is defined by the first electrode, the organic light emitting layer and the second electrode.

In an embodiment, the power line and the data line extend in a first direction parallel to a top surface of the substrate.

In an embodiment, the conductive pattern extends in a second direction parallel to the top surface of the substrate, and perpendicular to the first direction.

In an embodiment, the active pattern includes an oxide semiconductor.

Another aspect is an organic light-emitting diode (OLED) display comprising: a substrate; an active pattern formed over the substrate and including first to fourth regions, wherein the first and fourth regions are connected to each other; a gate insulation layer formed over the active pattern; a first gate electrode formed over the gate insulation layer, wherein the first gate electrode, the first region and the second region define a first transistor; a second gate electrode formed over the gate insulation layer, wherein the second gate electrode, the third region and the fourth region define a second transistor; a first insulating interlayer formed over the first and second gate electrodes; a conductive pattern formed over the first insulating interlayer, wherein the conductive pattern overlaps the first and fourth regions, and wherein the conductive pattern and the first gate electrode define a storage capacitor; and an OLED configured to receive a driving current from the first transistor.

The above OLED further comprises: a second insulating interlayer formed over the conductive pattern; and a data line formed over the second insulating interlayer, wherein the data line overlaps the fourth region of the active pattern.

In the above OLED display, the data line overlaps the third region of the active pattern and is connected to the third region.

In the above OLED display, the active pattern further includes fifth to fourteenth regions.

In the above OLED display, the second gate electrode, the fifth region and the sixth region define a third transistor, wherein the OLED display further comprises: a third gate electrode formed over the gate insulation layer, wherein the third gate electrode, the seventh region and the eighth region define a fourth transistor; a fourth gate electrode formed over the gate insulation layer, wherein the fourth gate electrode, the ninth region and the tenth region define a fifth transistor, and wherein the fourth gate electrode, the eleventh region and the twelfth region define a sixth transistor; and a fifth gate electrode formed over the gate insulation layer, wherein the fifth gate electrode, the thirteenth region and the fourteenth region define a seventh transistor.

In the above OLED display, the tenth region is connected to the first and fourth regions, wherein the second region is connected to the fifth and eleventh regions, wherein the sixth region is connected to the eighth region, and wherein the twelfth region is connected to the fourteenth region.

In the above OLED display, the first, fourth, and tenth regions are defined as a source node, wherein the source node is located between channel regions of the first, second and fifth transistors.

In the above OLED display, the conductive pattern overlaps at least about 50% of an area of the source node.

In the above OLED display, the conductive pattern overlaps at least about 80% of an area of the source node.

In the above OLED display, the second gate electrode is configured to receive a current scan signal from a gate driver, wherein the third and fifth gate electrodes are configured to receive a previous scan signal from the gate driver, wherein the fourth gate electrode is configured to receive an emission signal from a timing controller, and wherein the seventh and thirteen regions are configured to receive an initialization voltage from a power supply.

The above OLED display further comprises: a power line electrically connected to the conductive pattern and the ninth region of the active pattern; a first connection pattern electrically connected to the first and eighth regions; and a second connection pattern electrically connected to the twelfth region.

In the above OLED display, the data line is configured to receive a data signal from a data driver, wherein the power line is configured to receive a first power voltage from a power supply.

The above OLED display further comprises: a third insulating interlayer formed over the data line, the power line, the first connection pattern, and the second connection pattern; and a first electrode electrically connected to the second connection pattern.

The above OLED display further comprises: a pixel defining layer formed over the third insulating interlayer; an organic light emitting layer formed over the first electrode; and a second electrode formed over the pixel defining layer and the organic light emitting layer.

In the above OLED display, the second electrode is configured to receive a second power voltage from a power supply.

In the above OLED display, the first electrode, the organic light emitting layer and the second electrode define the OLED.

In the above OLED display, the power line and the data line extend in a first direction substantially parallel to a top surface of the substrate.

In the above OLED display, the conductive pattern extends in a second direction substantially parallel to the top surface of the substrate and crossing the first direction.

In the above OLED display, the active pattern includes an oxide semiconductor.

Another aspect is an organic light-emitting diode (OLED) display comprising: a substrate; an active pattern formed over the substrate and including first to fourth regions, wherein the first and fourth regions are connected to each other; a first gate electrode formed over the active pattern and defining a first transistor with the first and second regions; a second gate electrode formed over the active pattern and defining a second transistor with the second gate electrode and the third and fourth regions; a first insulating interlayer formed over the first and second gate electrodes; a conductive pattern formed over the first insulating interlayer, wherein the conductive pattern overlaps the first and fourth regions and defines a storage capacitor with the first gate electrode; and an OLED configured to receive a driving current from the first transistor.

DETAILED DESCRIPTION OF CERTAIN INVENTIVE EMBODIMENTS

Exemplary embodiments will be described more fully hereinafter with reference to the accompanying drawings, in which various embodiments are shown. In this disclosure, the term "substantially" includes the meanings of completely, almost completely or to any significant degree under some applications and in accordance with those skilled in the art. Moreover, "formed on" can also mean "formed over." The term "connected" can include an electrical connection.

Figure 1:
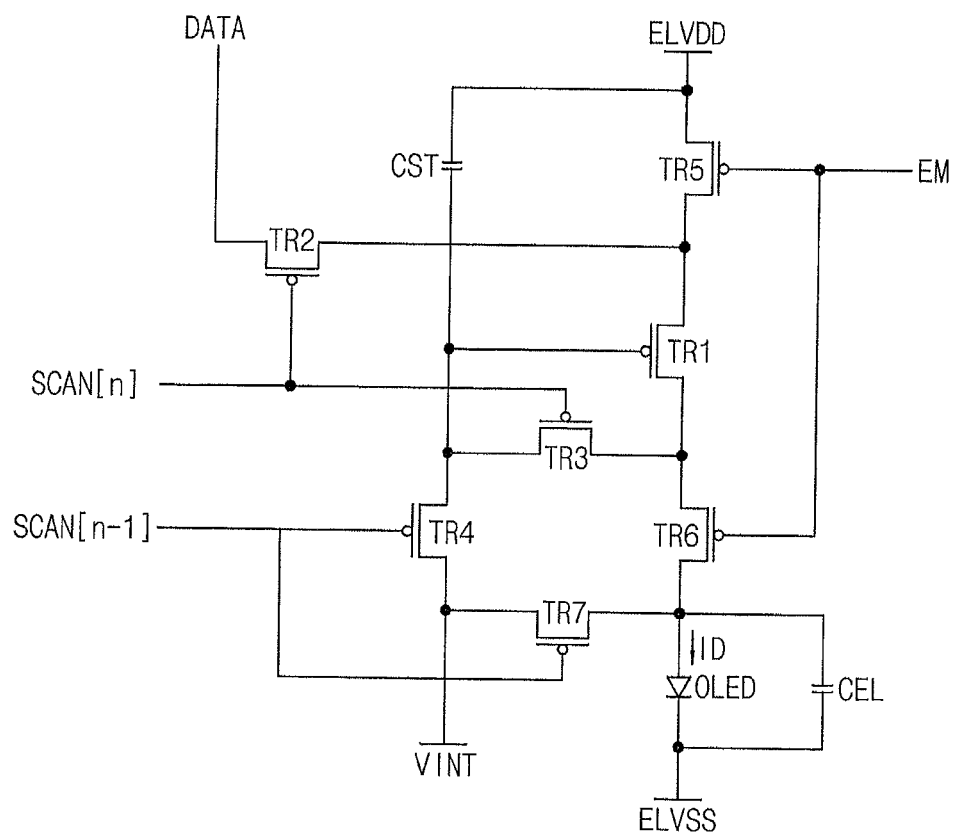
FIG. 1 is a circuit diagram illustrating a pixel in accordance with embodiments.

Referring to FIG. 1, a pixel 10 includes an organic light-emitting diode (OLED), a first transistor TR1, a second transistor TR2, a third transistor TR3, a storage capacitor CST, a fourth transistor TR4, a fifth transistor TR5, a sixth transistor TR6, and a seventh transistor TR7. In some embodiments, the pixel 10 further includes a cell capacitor CEL generated by a parasitic capacitance.

The OLED emits light based on a driving current ID. The OLED can include a first terminal and a second terminal. In some embodiments, the second terminal of the OLED receives a second power voltage ELVSS. In some embodiments, the first terminal is an anode, and the second terminal is a cathode of the OLED. Alternatively, the first terminal can be a cathode, and the second terminal can be an anode of the OLED.

The first transistor TR1 includes a gate terminal, a first terminal, and a second terminal. In some embodiments, the first terminal is a source terminal, and the second terminal is a drain terminal. Alternatively, the first terminal is a drain terminal, and the second terminal is a source terminal.

The driving current ID can be generated by the first transistor TR1. In some embodiments, the first transistor TR1 operates in a saturation region. In this case, the first transistor TR1 can generate the driving current ID based on a voltage difference of the gate terminal and the source terminal, and a gradation can be implemented based on an amount of the driving current ID generated by the first transistor TR1. In some embodiments, the first transistor TR1 operates in a linear region. In this case, a gradation can be implemented based on a time during which the first transistor TR1 provides the driving current ID to the OLED within one frame.

The second transistor TR2 can include a gate terminal, a first terminal, and a second terminal. The gate terminal can receive a current scan signal SCAN[n]. Here, the current scan signal SCAN[n] can be a scan signal with respect to a row of pixels including the pixel 10. The first terminal can receive a data signal DATA. The second terminal can be connected to the first terminal of the first transistor TR1. In some embodiments, the first terminal is a source terminal, and the second terminal is a drain terminal. Alternatively, the first terminal can be a drain terminal, and the second terminal can be a source terminal. The data signal DATA is supplied by a data driver.

The second transistor TR2 can transfer the data signal DATA to the first terminal of the first transistor TR1 during an active period of the current scan signal SCAN[n]. The second transistor TR2 can operate in a linear region.

The third transistor TR3 can include a gate terminal, a first terminal, and second terminal. The gate terminal can receive the current scan signal SCAN[n]. The first terminal can be connected to the second terminal of the first transistor TR1. The second terminal can be connected to the gate terminal of the first transistor TR1. In some embodiments, the first terminal is a source terminal, and the second terminal is a drain terminal. Alternatively, the first terminal can be a drain terminal, and the second terminal can be a source terminal.

The third transistor TR3 can connect the gate terminal of the first transistor TR1 and the second terminal of the first transistor TR1 to each other during the active period of the current scan signal SCAN[n]. In this case, the third transistor TR3 can operate in a linear region. For example, the third transistor TR3 allows the first transistor TR1 to be diode-connected during the active period of the current scan signal SCAN[n]. Thus, a voltage difference between the gate terminal of the first transistor TR1 and the first terminal of the first transistor TR1 can become a threshold voltage of the first transistor TR1. As a result, the sum of the data signal DATA and the threshold voltage of the first transistor TR1 can be provided to the gate terminal of the first transistor TR1 during the active period of the current scan signal SCAN[n]. Thus, the data signal DATA can be compensated by the threshold voltage of the first transistor TR1, and the compensated data signal DATA can be provided to the gate terminal of the first transistor T1. Accordingly, a threshold voltage deviation can be compensated, and thus uniformity of the driving current ID can be improved.

The storage capacitor CST can be connected between a first power voltage ELVDD and the gate terminal of the first transistor TR1. The storage capacitor CST can maintain a voltage level of the gate terminal of the first transistor TR1 during an inactive period of the current scan signal SCAN[n]. The inactive period of the current scan signal SCAN[n] can include an active period of an emission signal EM, and the driving current ID generated by the first transistor TR1 can be supplied to the OLED during an active period of the emission signal EM. Thus, the driving current ID generated based on the voltage level maintained by the storage capacitor CST can be supplied to the OLED. The emission signal EM is supplied by a timing controller. First power voltage ELVDD and second power voltage ELVSS is supplied by a power supply The fourth transistor TR4 can include a gate terminal, a first terminal, and a second terminal. The gate terminal can receive a previous scan signal SCAN[n−1]. Here, the previous scan signal SCAN[n−1] can be a scan signal with respect to a row (e.g., an (n−1)-th row) of pixels located adjacent to the row (e.g., an n-th row, where n is an integer greater than 1) of pixels including the pixel 10. The first terminal can receive an initialization voltage VINT. The second terminal can be connected to the gate terminal of the first transistor TR1. In some embodiments, the first terminal is a source terminal, and the second terminal is a drain terminal. Alternatively, the first terminal can be a drain terminal, and the second terminal can be a source terminal. The current scan signal SCAN[n] and previous scan signal SCAN[n−1] is supplied by a gate driver. The initialization voltage VINT is supplied by the power supply.

The fourth transistor TR4 can provide the initialization voltage VINT to the gate terminal of the first transistor TR1 during an active period of the previous scan signal SCAN[n−1]. In this case, the fourth transistor TR4 can operate in the linear region. For example, the fourth transistor TR4 initializes the gate terminal of the first transistor TR1 to the initialization voltage VINT during the active period of the previous scan signal SCAN[n−1]. As a result, the previous scan signal SCAN[n−1] can serve as a data initialization signal.

In some embodiments, the first transistor TR1 is a p-channel metal oxide semiconductor (PMOS) transistor, and a voltage level of the initialization voltage VINT applied to the gate terminal of the PMOS transistor is sufficiently lower than a voltage level of the data signal DATA maintained by the storage capacitor CST in a previous frame. Alternatively, the first transistor TR1 can be an n-channel metal oxide semiconductor (NMOS) transistor, and the voltage level of the initialization voltage VINT can be sufficiently higher than the voltage level of the data signal DATA maintained by the storage capacitor CST in the previous frame.

In some embodiments, the previous scan signal SCAN [n−1] applied to the fourth and seventh transistors TR4 and TR7 of the pixel 10 in a current row is substantially the same as a scan signal applied to the second and third transistors TR2 and TR3 of a pixel in a previous row. For example, the previous scan signal SCAN[n−1] applied to the fourth and seventh transistors TR4 and TR7 of an n-th row of the pixels 10 is substantially the same as the scan signal applied to the second and third transistors TR2 and TR3 of an (n−1)-th row of the pixels, where n is an integer greater than 1. Thus, while the previous scan signal SCAN[n−1] is applied to the second and third transistors TR2 and TR3 of the (n−1)-th row of the pixels, the previous scan signal SCAN[n−1] can also applied to the fourth and seventh transistors TR4 and TR7 of the n-th row of the pixels 10. Accordingly, while the data signal DATA is provided to the pixels in the (n−1)-th row, the gate terminal of the first transistor TR1 of the pixels 10 in the n-th row can receive the initialization voltage VINT.

The fifth transistor TR5 can include a gate terminal, a first terminal, and a second terminal. The gate terminal can receive the emission signal EM. The first terminal can receive the first power voltage ELVDD. The second terminal can be connected to the first terminal of the first transistor TR1. In some embodiments, the first terminal is a source terminal, and the second terminal is a drain terminal. Alternatively, the first terminal can be a drain terminal, and the second terminal can be a source terminal.

The fifth transistor TR5 can provide the first power voltage ELVDD to the first terminal of the first transistor TR1 during an active period of the emission signal EM. In contrast, the fifth transistor TR5 can block the first power voltage ELVDD during an inactive period of the emission signal EM. In some embodiments, the fifth transistor TR5 operates in the linear region. While the fifth transistor TR5 provides the first power voltage ELVDD to the first terminal of the first transistor TR1, the first transistor TR1 can generate the driving current ID. While the fifth transistor TR5 blocks the first power voltage ELVDD, the data signal DATA can be provided to the first terminal of the first transistor TR1.

The sixth transistor TR6 can include a gate terminal, a first terminal, and a second terminal. The gate terminal can receive the emission signal EM. The first terminal can be connected to the second terminal of the first transistor TR1. The second terminal can be connected to the first terminal of the OLED. In some embodiments, the first terminal is a source terminal, and the second terminal is a drain terminal. Alternatively, the first terminal can be a drain terminal, and the second terminal can be a source terminal.

The sixth transistor TR6 can provide the driving current ID generated by the first transistor TR1 to the OLED during the active period of the emission signal EM. In some embodiments, the sixth transistor TR6 operates in the linear region. While the sixth transistor TR6 provides the driving current ID to the OLED, the OLED can emit light based on the driving current ID. Further, the sixth transistor TR6 can electrically disconnect the first transistor TR1 from the OLED during the inactive period of the emission signal EM. While the OLED is disconnected from the first transistor TR1, a voltage (i.e., the data signal DATA compensated for the threshold voltage deviation) at the second terminal of the first transistor TR1 can be provided to the gate terminal of the first transistor TR1 through the third transistor TR3.

The seventh transistor TR7 can include a gate terminal, a first terminal, and a second terminal. The gate terminal can receive the previous scan signal SCAN[n−1]. The first terminal can receive the initialization voltage VINT. The second terminal can be connected to the first terminal of the OLED. In some embodiments, the first terminal is a source terminal, and the second terminal is a drain terminal. Alternatively, the first terminal can be a drain terminal, and the second terminal can be a source terminal.

The seventh transistor TR7 can provide the initialization voltage VINT to the first terminal of the OLED during the active period of the previous scan signal SCAN[n−1]. In some embodiments, the seventh transistor TR7 operates in the linear region. The seventh transistor TR7 can initialize the first terminal of the OLED to the initialization voltage VINT during the active period of the previous scan signal SCAN[n−1]. As a result, the previous scan signal SCAN[n−1] can serve as a diode initialization signal.

Figure 2:
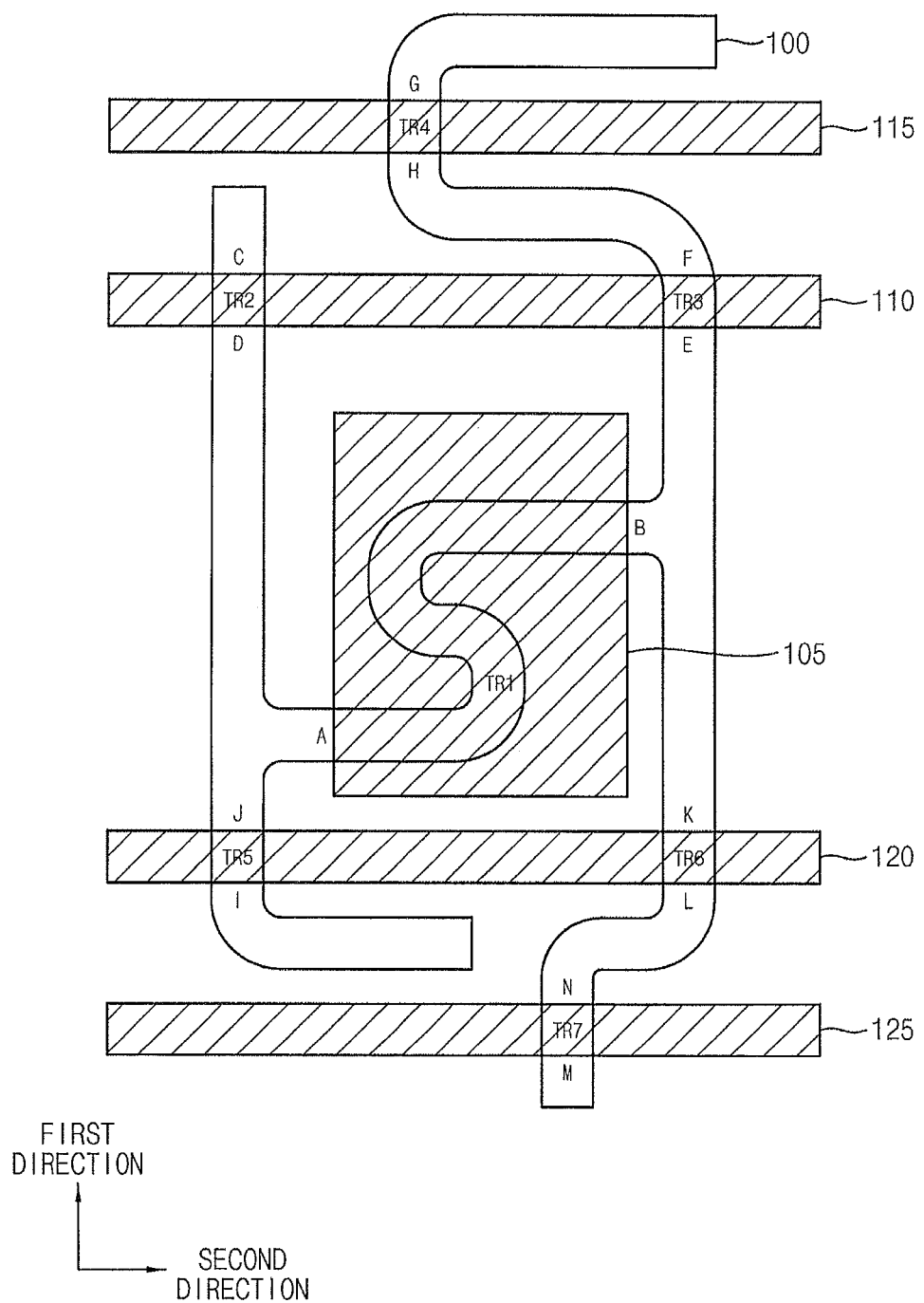
FIGS. 2 to 4 are layout diagrams illustrating an OLED display including the pixel in accordance with embodiments.
Figure 3:
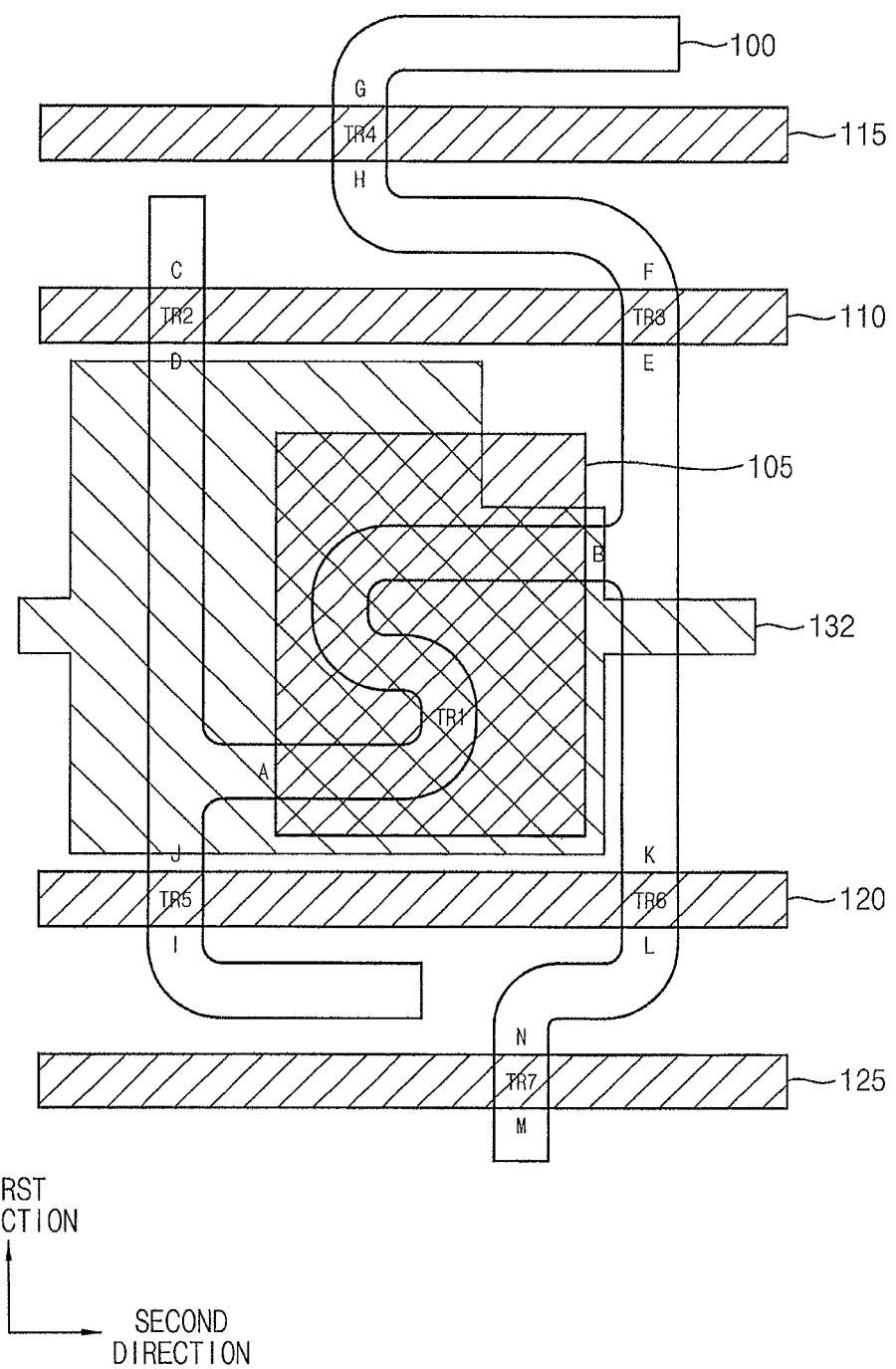
Figure 4:
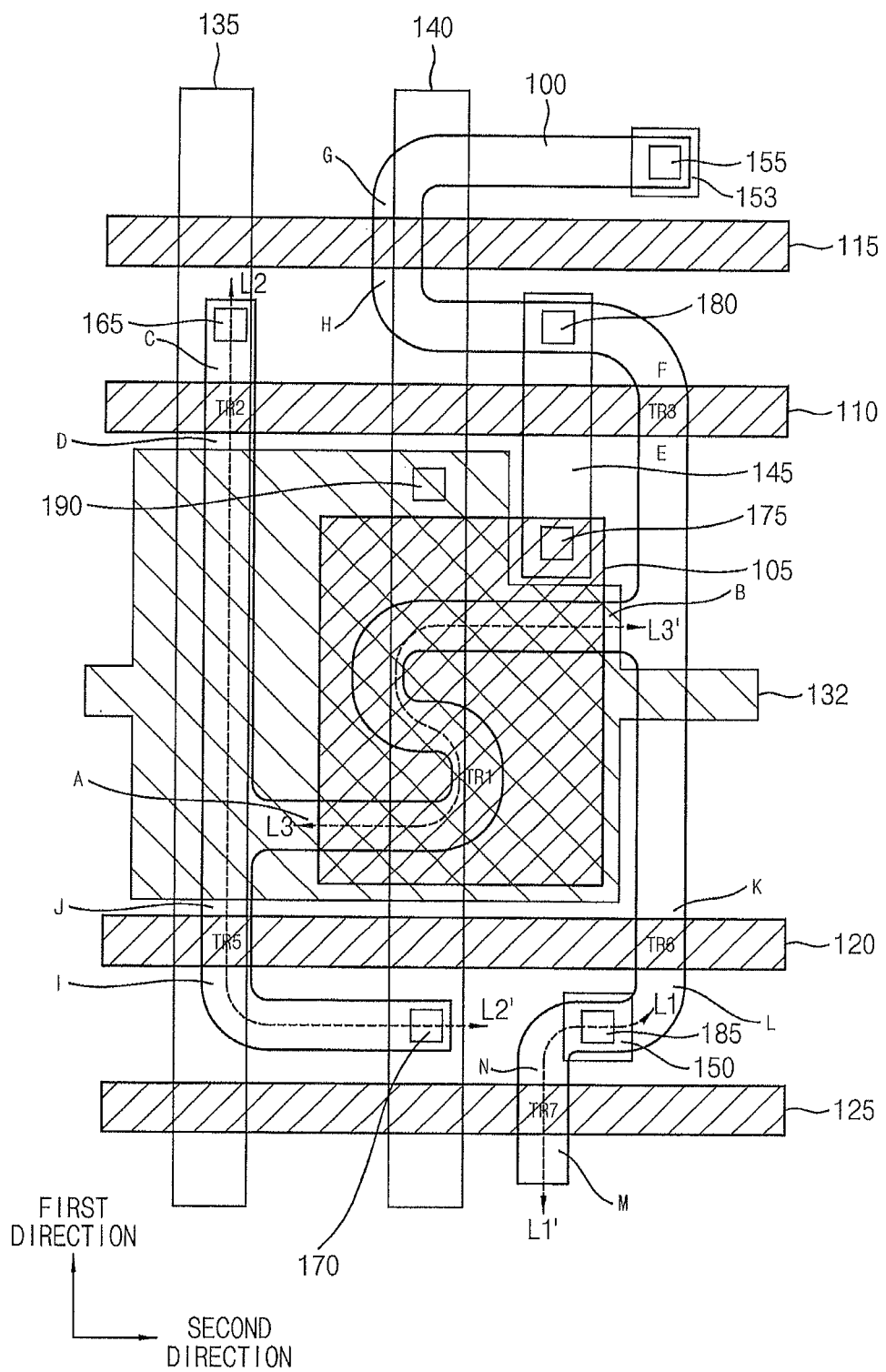

FIGS. 2 to 4 are layout diagrams illustrating an OLED display including the pixel in accordance with some embodiments.

Referring to FIG. 2, an OLED display includes a substrate (not illustrated), an active pattern 100, a gate insulation layer (not illustrated), a first gate electrode 105, a second gate electrode 110, a third gate electrode 115, a forth gate electrode 120, a fifth gate electrode 125.

The substrate can include an insulation material, such as a glass, a transparent plastic, a transparent metal oxide, etc. Although it is not illustrated, one or more buffer layers can be provided on the substrate. For example, the buffer layer is formed of silicon oxide, silicon nitride, silicon oxynitride, etc.

The active pattern 100 can be formed on the substrate. The active pattern 100 can be formed of silicon. Alternatively, the active pattern 100 can be formed of a semiconductor oxide including a binary compound (ABx), a ternary compound (ABxCy), a quaternary compound (ABxCyDz), etc. which contain indium, zinc, gallium, tin, titanium, aluminum, hafnium (Hf), zirconium (Zr), magnesium (Mg), etc. These compounds can be used alone or in combination thereof.

The active pattern 100 can include first through fourteenth regions A, B, C, D, E, F, G, H, I, J, K, L, M and N. The regions A, B, C, D, E, F, G, H, I, J, K, L, M and N can be doped with an impurity, and thus can have electrical conductivity higher than those of other regions of the active pattern 100. The regions A, B, C, D, E, F, G, H, I, J, K, L, M and N can be source terminals or drain terminals of first through seventh transistors TR1, TR2, TR3, TR4, TR5, TR6 and TR7. In some embodiments, the regions A, B, C, D, E, F, G, H, I, J, K, L, M and N are electrically connected to each other. For example, as illustrated in FIG. 2, the second region B does not have a clear boundary with the fifth region E and/or the eleventh region K, and the second, fifth and eleventh regions B, E and K are connected to each other.

The gate insulation layer can be formed on the substrate to cover the active pattern 100. The gate insulation layer can be formed of a silicon compound, metal oxide, etc. For example, the gate insulation layer is formed of silicon oxide, silicon nitride, silicon oxynitride, aluminum oxide, tantalum oxide, hafnium oxide, zirconium oxide, titanium oxide, etc., which can be used alone or in combination thereof. In some embodiments, the gate insulation layer has a multilayer structure including a silicon oxide layer and silicon nitride layer.

The first gate electrode 105, the second gate electrode 110, the third gate electrode 115, the fourth gate electrode 120 and the fifth gate electrode 125 can be formed on the gate insulation layer. The first gate electrode 105, the second gate electrode 110, the third gate electrode 115, the fourth gate electrode 120 and/or the fifth gate electrode 125 can be formed of metal, alloy, metal nitride, conductive metal oxide, transparent conductive material, etc. For example, the first gate electrode 105, the second gate electrode 110, the third gate electrode 115, the fourth gate electrode 120 and/or the fifth gate electrode 125 are formed of aluminum (Al), silver (Ag), tungsten (W), copper (Cu), nickel (Ni), chromium (Cr), molybdenum (Mo), titanium (Ti), platinum (Pt), tantalum (Ta), neodymium (Nd), scandium (Sc), and the alloy or a conductive nitride thereof. Alternatively, the first gate electrode 105, the second gate electrode 110, the third gate electrode 115, the fourth gate electrode 120 and/or the fifth gate electrode 125 can be formed of strontium ruthenium oxide (SrRuxOy), zinc oxide (ZnOx), indium tin oxide (ITO), tin oxide (SnOx), indium oxide (InOx), gallium oxide (GaOx), indium zinc oxide (IZO), etc.

The first gate electrode 105 can form or define the first transistor TR1 together with the first region A and the second region B. In some embodiments, the first region A is a source region, and the second region B is a drain region. Alternatively, the first region A can be a drain region, and the second region B can be a source region. The first region A and the second region B can be doped with the impurity. However, in some embodiments, a region of the active pattern 100 under the first gate electrode 105 is not be doped with the impurity. Thus, the first region A and the second region B can operate as conductors, and the region of the active pattern 100 under the first gate electrode 105 can operate as a channel of the first transistor TR1. Accordingly, the first transistor TR1 can generate a driving current ID of FIG. 1 provided to an OLED, and the OLED can emit light based on the driving current ID.

The second gate electrode 110 can form or define the second transistor TR2 together with the third region C and the fourth region D. In some embodiments, the third region C is a source region, and the fourth region D is a drain region. Alternatively, the third region C can be a drain region, and the fourth region D can be a source region.

The second gate electrode 110 can further form or define the third transistor TR3 together with the fifth region E, and the sixth region F. In some embodiments, the fifth region E is a source region, and the sixth region F is a drain region. Alternatively, the fifth region E can be a drain region, and the sixth region F can be a source region.

The fourth region D can be electrically connected to the first region A, and the fifth region E can be electrically connected to the second region B. The third region C, the fourth region D, the fifth region E and the sixth region F can be doped with the impurity. However, in some embodiments, regions of the active pattern 100 under the second gate electrode 110 are not doped with the impurity. Thus, the third region C, the fourth region D, the fifth region E, and the sixth region F can operate as the conductors, and the regions of the active pattern 100 under the second gate electrode 110 can operate as channels of the second transistor TR2 and the third transistor TR3. In some embodiments, the second gate electrode 110 receives a current scan signal SCAN[n] illustrated in FIG. 1.

The third gate electrode 115 can form or define the fourth transistor TR4 together with the seventh region G and the eighth region H. In some embodiments, the seventh region G is a source region, and the eighth region H is a drain region. Alternatively, the seventh region G can be a drain region, and the eighth region H can be a source region.

The eighth region H can be electrically connected to the sixth region F. The seventh region G and the eighth region H can be doped with the impurity. However, in some embodiments, a region of the active pattern 100 under the third gate electrode 115 is not doped with the impurity. Thus, the seventh region G and the eighth region H can operate as the conductors, and the region of the active pattern 100 under the third gate electrode 115 can operate as a channel of the fourth transistor TR4. In some embodiments, the third gate electrode 115 receives a previous scan signal SCAN[n−1] illustrated in FIG. 1.

The fourth gate electrode 120 can form or define the fifth transistor TR5 together with the ninth region I and the tenth region J. In some embodiments, the ninth region I is a source region, and the tenth region J can be a drain region. Alternatively, the ninth region I can be a drain region, and the tenth region J can be a source region.

The fourth gate electrode 120 can further form or define the sixth transistor TR6 together with the eleventh region K and the twelfth region L. In some embodiments, the eleventh region K is a source region, and the twelfth region L is a drain region. Alternatively, the eleventh region K can be a drain region, and the twelfth region L can be a source region.

The tenth region J can be electrically connected to the first region A, and the eleventh region K can be electrically connected to the second region B. The ninth region I, the tenth region J, the eleventh region K, and the twelfth region L can be doped with the impurity. However, in some embodiments, regions of the active pattern 100 under the fourth gate electrode 120 are not doped with the impurity. Thus, the ninth region I, the tenth region J, the eleventh region K and the twelfth region L can operate as the conductors, and the regions of the active pattern 100 under the fourth gate electrode 120 can operate as channels of the fifth transistor TR5 and the sixth transistor TR6. In some embodiments, the fourth gate electrode 120 receives an emission signal EM illustrated in FIG. 1.

The fifth gate electrode 125 can form or define the seventh transistor TR7 together with the thirteenth region M and the fourteenth region N. In some embodiments, the thirteenth region M is a source region, and the fourteenth region N is a drain region. Alternatively, the thirteenth region M can be a drain region, and the fourteenth region N can be a source region.

The fourteenth region N can be electrically connected to the twelfth region L. The thirteenth region M and fourteenth region N can be doped with the impurity. However, in some embodiments, a region of the active pattern 100 under the fifth gate electrode 125 is not doped with the impurity. Thus, the thirteenth region M and fourteenth region N can operate as the conductors, and the region of the active pattern 100 under the fifth gate electrode 125 can operate as a channel of the seventh transistor TR7. In some embodiments, the seven region G and the thirteen region M receives an initialization voltage VINT illustrated in FIG. 1.

The first region A, the fourth region D and the tenth region J of the active pattern 100 can be defined as a source node. Thus, the source node can be located between the channel regions of the first transistor TR1, the second transistor TR2 and the fifth transistor TR5.

Referring to FIG. 3, an OLED display includes a substrate (not illustrated), an active pattern 100, a gate insulation layer (not illustrated), a first gate electrode 105, a second gate electrode 110, a third gate electrode 115, a forth electrode 120, and a fifth electrode 125 as shown in FIG. 2. The OLED display can further include an insulating interlayer (not illustrated) and a conductive pattern 132.

The insulating interlayer can be formed on the gate insulation layer to cover the first gate electrode 105, the second gate electrode 110, the third gate electrode 115, the fourth gate electrode 120 and the fifth gate electrode 125. The second gate electrode 110, the third gate electrode 115, the fourth gate electrode 120, the fifth gate electrode 125 and the insulating interlayer can be formed of an organic material, such as a silicon compound, or an inorganic material, such as a transparent insulating resin. For example, the insulating interlayer is formed of a silicon oxide, a silicon nitride, a silicon oxynitride, and etc. These can be used alone or in combination with each other.

The conductive pattern 132 can be on the insulating interlayer. The conductive pattern 132 can be formed of metal, alloy, metal nitride, conductive metal oxide, transparent conductive material, etc. These can be used alone or in combination with each other.

The conductive pattern 132 can extend in a direction parallel to an upper surface of the substrate from an overlapped portion with the first gate electrode 105. As a result, the conductive pattern 132 can be formed to overlap the first region A, the fourth region D, and the tenth region J of the active pattern 100. That is, the conductive pattern 132 can be formed to overlap with the source node of the active pattern 100. In some embodiments, the conductive pattern 132 overlaps at least about 50% of an area of the source node. In some embodiments, the conductive pattern 132 overlaps at least about 80% of the area of the source node. In some embodiments, the conductive pattern 132 receives the first power voltage ELVDD in FIG. 1 through a line that will be described below.

In some embodiments, the conductive pattern 132 extends in a second direction that is parallel to the upper surface of the substrate. That is, the conductive pattern 132 on one pixel can directly contact the conductive pattern 132 on another pixel formed adjacent to the one pixel in the second direction.

Referring to FIG. 4, an OLED display includes a substrate (not illustrated), an active pattern 100, a gate insulation layer (not illustrated), a first gate electrode 105, a second gate electrode 110, a third gate electrode 115, a forth electrode 120, a fifth electrode 125, an insulating interlayer (not illustrated), and a conductive pattern 132 as shown in FIG. 3. The OLED display further includes a first insulating interlayer (not illustrated), a data line 135, a power line 140, a first connection pattern 145, and a second connection pattern 150. In some embodiments, the OLED display further includes a third connection pattern 153.

The first insulating interlayer can be formed on the insulating interlayer to cover the conductive pattern 132. In some embodiments, the first insulating interlayer at least partially covers the conductive pattern 132, and has a substantially flat upper surface without a difference of elevation around the conductive pattern 132. The first insulating interlayer can be formed of an organic material, such as a silicon compound, or an inorganic material, such as a transparent insulating resin. For example, the first insulating interlayer is formed of a silicon oxide, a silicon nitride, a silicon oxynitride, and etc. These can be used alone or in combination with each other.

The data line 135, the power line 140, the first connection pattern 145, the second connection pattern 150 and the third connection pattern 153 can be on the first insulating interlayer. The data line 135, the power line 140, the first connection pattern 145, the second connection pattern 150 and the third connection pattern 153 can formed of metal, alloy, metal nitride, conductive metal oxide, transparent conductive material, etc. These can be used alone or in combination with each other.

The data line 135 can be electrically connected to a third region C of the active pattern 100. For example, the data line 135 is connected to the third region C through a first contact hole 165. In some embodiments, the data line 135 receives a data signal DATA of FIG. 1. As a result, the data line 135 can provide the data signal DATA to the third region C through the first contact hole 165.

The data line 135 can extend in a first direction parallel to an upper surface of the substrate. The data line 135 can be formed to overlap a portion of the active pattern 100. For example, the data line 135 is formed to overlap a fourth region D and a tenth region J of the active pattern 100. As described above, the fourth region D and the tenth region J of the active pattern 100 can be doped with an impurity, and can have a relatively high electrical conductivity.

A parasitic capacitance can be unavoidably generated between the data line 135 and the fourth and tenth regions D and J of the active pattern 100, this parasitic capacitance can cause a driving current applied to a first electrode (e.g., an anode electrode) to be reduced. In some embodiments, when an image having low gradation levels is displayed in the OLED display, an AID dimming (AMOLED impulsive driving dimming) method is used. In the AID dimming method, a gamma value can be maintained, and the gradation level can be controlled by adjusting an activation time of the emission signal EM. For example, when a gradation level of V255 2nit is represented, the gamma value corresponding to about 100nit is used, and the activation time of the emission signal EM is reduced to about 2%. However, when the AID dimming method is used and the above mentioned parasitic capacitance is generated, undesirable horizontal stripes can be displayed on a screen of the OLED display.

However, in the OLED display according to example embodiments, the conductive pattern 132 is located between the fourth region D and the tenth region J of the active pattern 100. Since the conductive pattern 132 is located between the fourth region D and the tenth region J, the conductive pattern 132 can reduce the parasitic capacitance between the data line 135 and the fourth and tenth regions D and J of the active pattern 100. As a result, even if the AID dimming method is used, the undesirable horizontal stripes is not seen on the screen of the OLED display, and an image quality is improved.

Power line 140 can be electrically connected to the conductive pattern 132 and the ninth region I of the active pattern 100. For example, the power line 140 is connected to the ninth region I through a second contact hole 170, and is connected to the conductive pattern 132 through an additional contact hole 190. In some embodiments, the power line 140 receives a first power voltage ELVDD of FIG. 1. As a result, the power line 140 can provide the first power voltage ELVDD to the ninth region I through the second contact hole 170, and can provide the first power voltage ELVDD to the conductive pattern 132 through the additional contact hole 190.

In some embodiments, the power line 140 extends in the first direction parallel to the upper surface of the substrate.

The first connection pattern 145 can be electrically connected to the first gate electrode 105 and the eighth region H of the active pattern 100. For example, the first connection pattern 145 is connected to the first gate electrode 105 through a third contact hole 175, and is connected to the eighth area h through a fourth contact hole 180. As a result, the first connection pattern 145 can electrically connect the first gate electrode 105 and the eighth region H to each other through the third contact hole 175 and the fourth contact hole 180.

The second connection pattern 150 can be electrically connected to a twelfth region L of the active pattern 100. For example, the second connection pattern 150 is connected to the twelfth region L through a fifth contact hole 185. As a result, the driving current ID generated by the first transistor TR1 of FIG. 1 can be provided to the OLED.

The third connection pattern 153 can be connected to a seventh region G. For example, the third connection pattern 153 is connected to the seventh region G through a seventh contact hole 155. In some embodiments, the third connection pattern 153 receives the initialization voltage VINT of FIG. 1. As a result, the third connection pattern 153 can provide the initialization voltage VINT to the seventh region G through the seventh contact hole 155.

An additional connection pattern (not illustrated) can be further formed. The additional connection pattern can be electrically connected to a thirteenth region M of the active pattern 100. Thus, the additional connection pattern can provide the initialization voltage VINT to the thirteen region M.

In some embodiments, the OLED display further includes a second insulating interlayer (not illustrated), a first electrode (e.g. an anode electrode) (not illustrated), a pixel defining layer (not illustrated), an organic light emitting layer (not illustrated), and a second electrode (e.g. a cathode electrode) (not illustrated).

The second insulating interlayer can be formed on the first insulating interlayer to cover the data line 135, the power line 140, the first connection pattern 145, and the second connection pattern 150. In some embodiments, the second insulating interlayer at least partially covers the data line 135, the power line 140, the first connection pattern 145, and the second connection pattern 150, and has a substantially flat upper surface without a difference of elevation around the data line 135, the power line 140, the first connection pattern 145 and the second connection pattern 150. The second insulating interlayer can be formed of an organic material, such as a silicon compound, or an inorganic material, such as a transparent insulating resin. For example, the second insulating interlayer can be formed of silicon oxide, silicon nitride, silicon oxynitride, etc. These can be used alone or in combination with each other.

The first electrode can be on the second insulating interlayer. In some embodiments, the first electrode is formed on a portion of the second insulating interlayer. The first electrode can is formed of metal, alloy, metal nitride, conductive metal oxide, and transparent conductive material. These can be used alone or in combination with each other.

The first electrode can be electrically connected to the second connection pattern 150. For example, the first electrode is connected to the second connection pattern 150 through the seventh contact hole (not illustrated). As a result, the first electrode can receive the driving current ID of FIG. 1 through the seventh contact hole. In some embodiments, the first electrode is an anode terminal. Alternatively, the first electrode can be a cathode terminal.

The pixel defining layer can be on the second insulating interlayer. In some embodiments, the pixel defining layer is on the second insulating interlayer and a portion of the first electrode. The pixel defining layer can form an opening at a portion of the first electrode on the insulating interlayer, and the organic light emitting layer can be formed in the opening. The organic light emitting layer can be on the first electrode. In some embodiments, the organic light emitting layer is on the first electrode exposed through the opening of the pixel defining layer. The organic light emitting layer can be formed of a light emitting material that can emit light. The light emitting material can include organic materials. In some embodiments, the light emitting material includes organic materials corresponding to wavelengths of red light, green light, and/or blue light.

The second electrode can be on the pixel defining layer and the organic light emitting layer. In some embodiments, the second electrode is formed of a transparent conductive material. For example, the second electrode is formed of indium tin oxide, indium zinc oxide, zinc oxide, tin oxide, gallium oxide, indium oxide, etc. In some embodiments, the second electrode is a cathode terminal. The first electrode, the organic light emitting layer and the second electrode can form the OLED of FIG. 1. Alternatively, the second electrode can be an anode terminal. In some embodiments, the second electrode receives the second power voltage ELVSS of FIG. 1.

Figure 5:
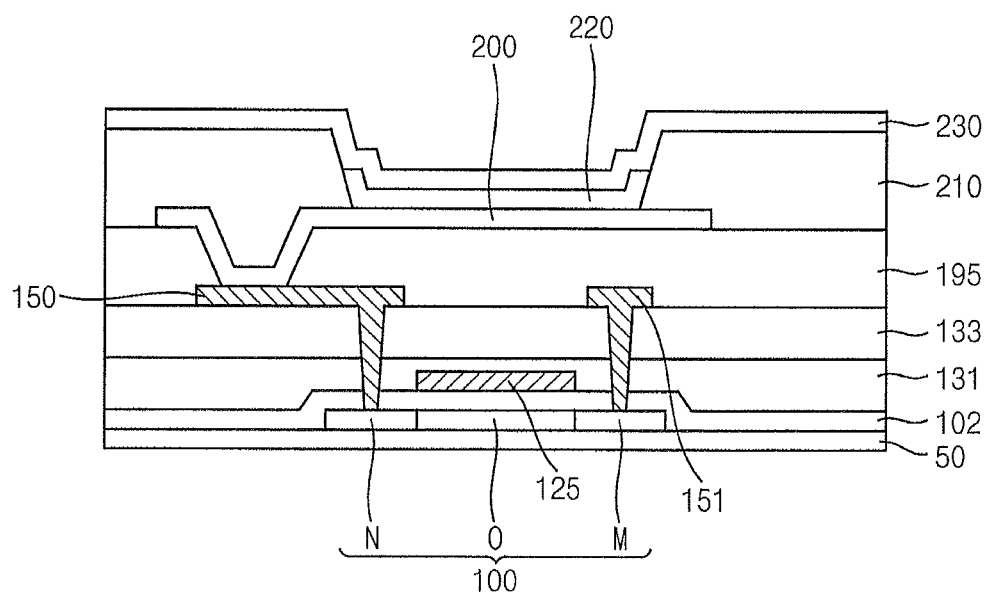
FIG. 5 is a cross-sectional view taken along a line L1-L1'line of FIG. 4.
Figure 6:
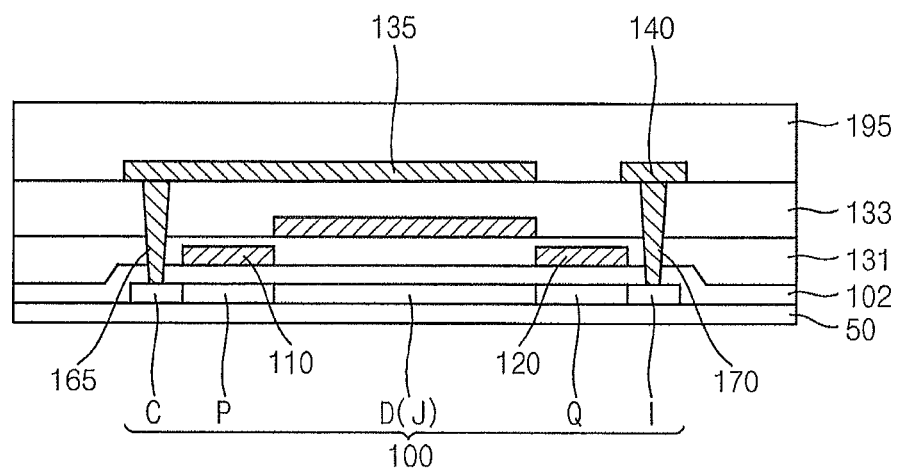
FIG. 6 is a cross-sectional view taken along a line L2-L2'of FIG. 4.

As a result, the OLED display of FIGS. 4 to 6 includes the pixel of FIG. 1 that improves a response speed of the OLED. As described above, according to the location of the conductive pattern 132, the parasitic capacitance between the active pattern 100 and the data line 135 can be prevented or reduced.

FIG. 5 is a cross-sectional view taken along a line L1-L1' line of FIG. 4.

Referring to FIG. 5, the OLED display includes a substrate 50, an active pattern 100, a gate insulation layer 102, a fifth gate electrode 125, a first insulating interlayer 131, a second connection pattern 150, an additional connection pattern 151, a second insulating interlayer 133, the third insulating interlayer 195, a first electrode 200, a pixel defining layer 210, an organic light emitting layer 220, and a second electrode 230.

The active pattern 100 can be on the substrate 50. The substrate 50 can be formed of a transparent insulating material such as glass, transparent plastic, and transparent ceramic. The active pattern 100 can include a thirteenth region M, a fourteenth region N, and fifteenth region O. The fifteenth region O can be located between the thirteenth region M and the fourteenth region N, and can be located under the fifth gate electrode 125 that is described below.

As described above, the gate insulation layer 102 can be formed to cover the active pattern 100. The fifth gate electrode 125 can be formed on the gate insulation layer 102, and the first insulating interlayer 131 and the second insulating interlayer 133 can be formed to cover the fifth gate electrode 125. In some embodiments, the first and second insulating interlayer 133 is formed with a high thickness to at least partially cover the fifth gate electrode 125. In this case, the first insulating interlayer 131 and the second insulating interlayer 133 can have a substantially flat upper surface.

The contact holes that expose the thirteenth region M and the fourteen region N can be formed by partially etching the first insulating interlayer 131 and the second insulating interlayer 133, respectively. Subsequently, the second connection pattern 150 and the additional connection pattern 151 can be formed on the second insulating interlayer 133 by filling the respective contact holes.

The third insulating interlayer 195 can be formed on the second insulating interlayer 133 to cover the second connection pattern 150 and the additional connection pattern 151. In some embodiments, the third insulating interlayer 195 is formed with a high thickness to at least partially cover the second connection pattern 150 and the additional connection pattern 151. In this case, the third insulating interlayer 195 can have a substantially flat upper surface, and a planarization process can be further performed on the third insulating interlayer 195 to implement the flat upper surface of the third insulating interlayer 195.

The seventh contact hole that exposes a portion of the second connection pattern 150 can be formed by partially etching the third insulating interlayer 195. Subsequently, the first electrode 200 can be formed on the third insulating interlayer 195 by filling the seventh contact hole. The first electrode 200 can be formed on a portion of the third insulating interlayer 195.

The pixel defining layer 210 covering the first electrode 200 can be formed on the third insulating interlayer 195. The pixel defining layer 210 can form an opening on a portion of the first electrode 200, and the organic light emitting layer 220 can be formed in the opening. Thus, the organic light emitting layer 220 can be on the first electrode 200 exposed through the opening of the pixel defined layer 210.

Finally, the second electrode 230 can be formed on the pixel defined layer 210 and the organic light emitting layer 220.

FIG. 6 is a cross-sectional view taken along a line L2-L2' of FIG. 4.

Referring to FIG. 6, the OLED display includes a substrate 50, an active pattern 100, a gate insulation layer 102, a second gate electrode 110, a fourth gate electrode 120, a first insulating interlayer 131, a conductive pattern 132, a second insulating interlayer 133, a data line 135, a power line 140, and the third insulating interlayer 195.

The substrate 50, the active pattern 100, the gate insulation layer 102, the second gate electrode 110, the fourth gate electrode 120, the first insulating interlayer 131 and the second insulating interlayer 133 can be substantially the same as or similar to configurations described above with reference to FIG. 5.

The active pattern 100 can include a third region C, a fourth region D, a ninth region I, a tenth region J, a sixteenth region P, and a seventeenth region Q. The sixteenth region P can be located under the second gate electrode 110, and the seventeenth region Q can be located under the fourth gate electrode 120.

The conductive pattern 132 can be formed between the first insulating interlayer 131 and the second insulating interlayer 133. As described above, the conductive pattern 132 can reduce the parasitic capacitance between the data line 135 and the fourth and tenth regions D and J of the active pattern 100.

Figure 7:
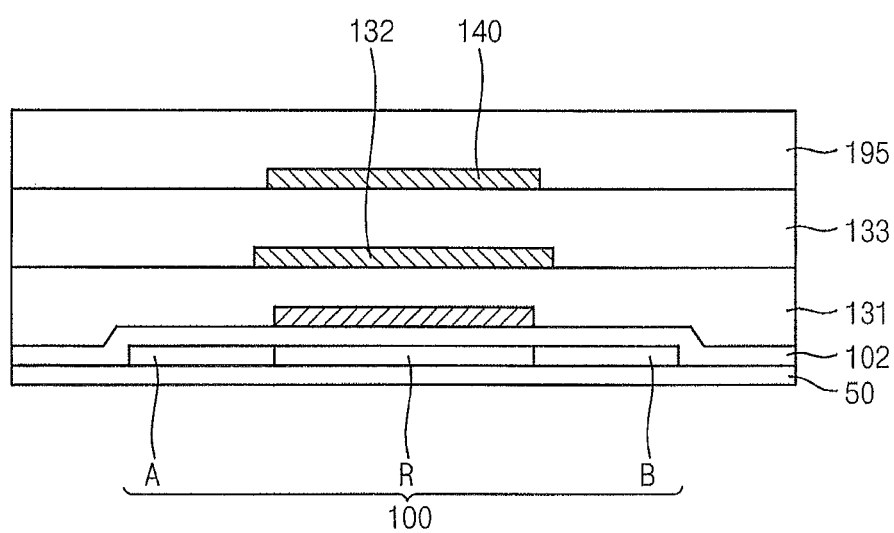
FIG. 7 is a cross-sectional view taken along a line L3-L3'line of FIG. 4.

FIG. 7 is a cross-sectional view taken along a line L3-L3' line of FIG. 4.

Referring to FIG. 7, the OLED display includes a substrate 50, an active pattern 100, the gate insulation layer 102, the first gate electrode 105, a first insulating interlayer 131, a conductive patterns 132, a second insulating interlayer 133, a data line 135, a power line 140, and a third insulating interlayer 195.

As described above, a storage capacitor can be formed by the first gate electrode 105 and the conductive pattern 132.

Figure 8:
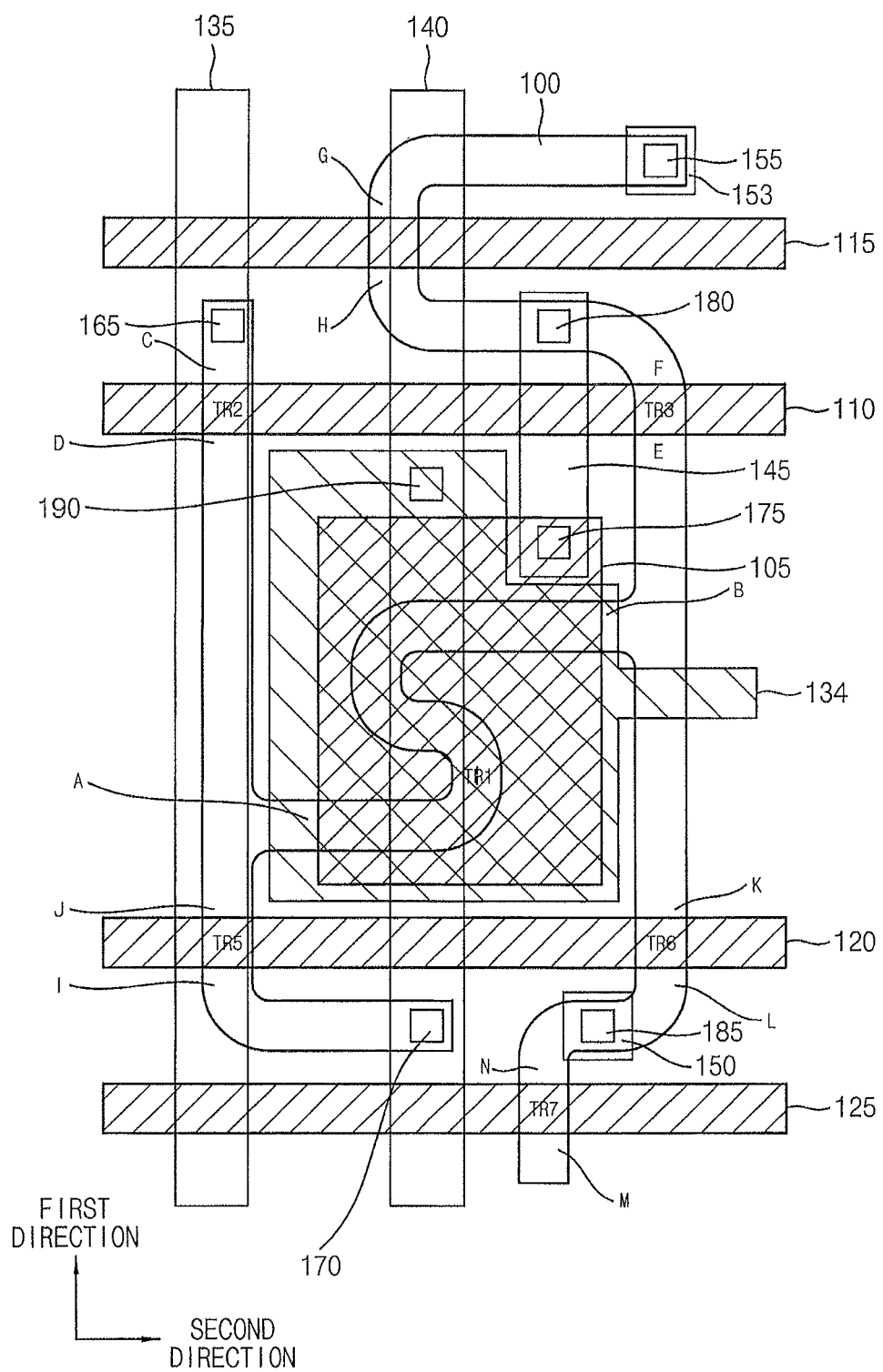
FIG. 8 is a layout diagram illustrating an OLED display of comparative examples.

FIG. 8 is a layout diagram illustrating an OLED display of comparative examples.

The OLED display, as shown in FIG. 4, includes a substrate (not illustrated), an active pattern 100, a gate insulation layer (not illustrated), a first gate electrode 105, a second gate electrode 110, a third gate electrode 115, a fourth gate electrode 120, a fifth gate electrode 125, an insulating interlayer (not illustrated), and a conductive pattern 134. The OLED display can further include a first insulating interlayer (not illustrated), a data line 135, a power line 140, a first connection pattern 145, and a second connection pattern 150. In some embodiments, the OLED display further includes a third connection pattern 153.

Except for the conductive pattern 134, the OLED display can be substantially the same as or similar to a configuration described above with reference to FIG. 1 through FIG. 7. Accordingly, a description for a repeated configuration will be omitted.

The conductive pattern 134 can be on the insulating interlayer. The conductive pattern 132 can be formed to overlap the first gate electrode 105. Accordingly, the conductive pattern 134 can form a storage capacitor CST of FIG. 1 together with the first gate electrode 105. The conductive patterns 134 can be formed not to overlap the first region A, the fourth region D and a tenth region J of an active pattern 100. Accordingly, the parasitic capacitance can be generated between the data line 135, the fourth and tenth regions D and J of the active pattern 100. As described above, the parasitic capacitance can cause the driving current applied to the first electrode to be reduced.

Figure 9:
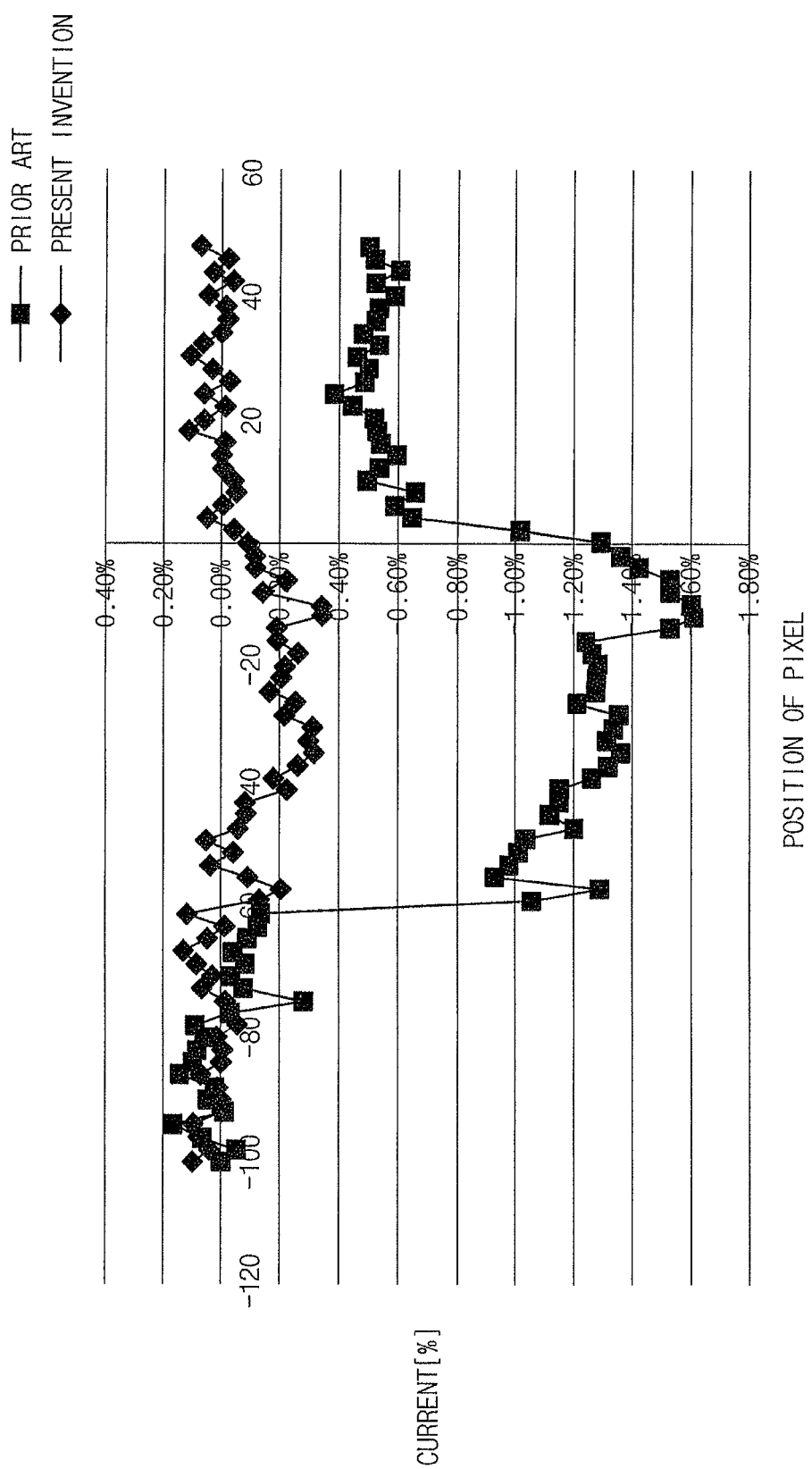
FIG. 9 is a graph showing a current difference according to a pixel location in embodiments and comparative examples.

FIG. 9 is a graph showing a current difference according to a pixel location in embodiments and comparative examples.

In the graph, an X axis represents the position of each individual pixel, and a Y axis represents a value of the driving current applied to a first electrode (i.e., a pixel electrode). The first electrode corresponds to an individual pixel.

Referring to FIG. 9, according to a comparative example, the value of the driving current is fallen in some pixels. However, according to an embodiment of the described technology, the value of the driving current is maintained as a substantially constant value. That is, the parasitic capacitance can be reduced by a position and a shape of the conductive pattern according to the embodiment. In addition, the driving current can be prevented from being decreased.

The foregoing is illustrative of embodiments and is not to be construed as limiting thereof. Although a few embodiments have been described, those skilled in the art will readily appreciate that many modifications are possible in embodiments without materially departing from the novel teachings and advantages of the inventive technology. Accordingly, all such modifications are intended to be included within the scope of embodiments as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. An organic light-emitting diode (OLED) display comprising:
   a substrate;
   an active layer on the substrate, wherein the active layer comprises first, second, third, and fourth regions, wherein the first and fourth regions are connected to each other through a connecting region;
   a first line extending in a first direction, wherein at least a portion of the first line overlaps the connecting region;
   a first transistor comprising a portion of the active layer between the first region and the second region;
   a second transistor comprising a portion of the active layer between the third region and the fourth region;
   an organic light emitting diode electrically coupled to the first transistor; and
   a capacitor comprising a first electrode and a second electrode over the first electrode, wherein the second electrode overlaps with at least an area of the first electrode,
   wherein the second electrode comprises:
   a first portion that overlaps at least an area in which the connecting region of the active layer and the first line are overlapped with each other; and
   a second portion extending from the first portion in a second direction crossing the first direction, and
   wherein a width in the first direction of the first portion of the second electrode is greater than a width in the first direction of the second portion.

2. The OLED display of claim 1, wherein the first electrode of the capacitor is between the first region and the second region in a plan view.

3. The OLED display of claim 2, wherein the second electrode of the capacitor is between a gate electrode layer and a source/drain electrode layer.

4. The OLED display of claim 1, further comprising:
   a power line on the substrate and extending in the first direction, and
   wherein the second electrode of the capacitor is coupled to the power line through a contact hole, and is configured to receive a first power voltage through the power line.

5. The OLED display of claim 1, further comprising:
   a first insulating layer on the substrate; and
   a second insulating layer on the first insulating layer, wherein the second electrode of the capacitor is between a first insulating interlayer and a second insulating interlayer.

6. The OLED display of claim 1, further comprising:
   a power line on the substrate and extending in the first direction, and
   wherein the first line is a data line and the second electrode of the capacitor is overlapped with the data line and the power line.

7. The OLED display of claim 6, wherein the second portion of the second electrode is connected to a second electrode of a capacitor in an adjacent pixel in the second direction.

8. The OLED display of claim 1, wherein the second electrode is formed across the connecting region.

9. The OLED display of claim 1, wherein the first line is a data line, and the second transistor is connected to the data line through a contact hole.

10. The OLED display of claim 1, further comprising:
    a gate insulation layer over the active layer;
    a first insulating interlayer over the first electrode; and
    a second insulating interlayer over the second electrode.

11. The OLED display of claim 1, wherein the first line overlaps the third region of the active layer and is connected to the third region.

12. The OLED display of claim 1, wherein the active layer further comprises fifth, sixth, seventh, eighth, ninth, tenth, eleventh, twelfth, thirteenth, and fourteenth regions.

13. The OLED display of claim 12, further comprising:
    a third transistor comprising the active layer between the fifth region and the sixth region;
    a fourth transistor comprising the active layer between the seventh region and the eighth region;
    a fifth transistor comprising the active layer between the ninth region and the tenth region;
    a sixth transistor comprising the active layer between the eleventh region and the twelfth region; and
    a seventh transistor comprising the active layer between the thirteenth region and the fourteenth region, and
    wherein the connecting region is located between the first transistor, the second transistor, and the fifth transistor.

14. The OLED display of claim 12, wherein the tenth region is connected to the first region and the connecting region,
    wherein the second region is connected to the fifth region and the eleventh region,
    wherein the sixth region is connected to the eighth region, and
    wherein the twelfth region is connected to the fourteenth region.

15. The OLED display of claim 1, wherein at least a portion of the active layer extends in parallel with the first line.

16. The OLED display of claim 1, further comprising:
    a power line on the substrate, a first power voltage being applied thereto, and
    wherein the second electrode of the capacitor is coupled to the power line through a contact hole, and the contact hole is spaced apart from the first electrode of the capacitor in a plan view.

17. An organic light-emitting diode (OLED) display comprising:
    a substrate;
    an active layer on the substrate, wherein the active layer comprises first, second, third, and fourth regions, wherein the first and fourth regions are connected to each other through a connecting region;
    a first line extending in a first direction, wherein at least a portion of the first line overlaps the connecting region;
    a first transistor comprising a portion of the active layer between the first region and the second region;
    a second transistor comprising a portion of the active layer between the third region and the fourth region;
    an organic light emitting diode electrically coupled to the first transistor; and
    a capacitor comprising a first electrode and a second electrode over the first electrode, wherein the second electrode overlaps with at least an area of the first electrode; and
    a second line extending in the first direction, wherein at least a portion of the second line overlaps the first electrode,
    wherein the second electrode comprises an expansion portion that overlaps at least an area in which the connecting region of the active layer and the first line are overlapped with each other and a portion of the second line.

18. The OLED display of claim 17, wherein the second electrode further comprises a connecting portion extending in a second direction crossing the first direction and connected to a second electrode of a capacitor in an adjacent pixel in the second direction.

19. The OLED display of claim 17, wherein the first line is a data line, and the second line is a power line.

20. An organic light-emitting diode (OLED) display comprising:
- a substrate;
- an active layer on the substrate, wherein the active layer comprises first, second, third, and fourth regions, wherein the first and fourth regions are connected to each other through a connecting region;
- a first line extending in a first direction, wherein at least a portion of the first line overlaps the connecting region;
- a first transistor comprising a portion of the active layer between the first region and the second region;
- a second transistor comprising a portion of the active layer between the third region and the fourth region;
- an organic light emitting diode electrically coupled to the first transistor;
- a capacitor comprising a first electrode and a second electrode over the first electrode, wherein the second electrode overlaps with at least an area of the first electrode; and
- a second line extending in the first direction, wherein at least a portion of the second line overlaps the first electrode, wherein at least a portion of the second electrode is disposed between the connecting region of the active layer and the first line, and wherein a width in the first direction of a first portion of the second electrode that overlaps the first line is less than or equal to a width in the first direction of a second portion of the second electrode that overlaps the second line.

* * * * *